US012326668B2

(12) United States Patent
Nakayama et al.

(10) Patent No.: US 12,326,668 B2
(45) Date of Patent: Jun. 10, 2025

(54) DETECTION APPARATUS, LITHOGRAPHY APPARATUS, AND ARTICLE MANUFACTURING METHOD

(71) Applicant: CANON KABUSHIKI KAISHA, Tokyo (JP)

(72) Inventors: Ryo Nakayama, Tochigi (JP); Yasuyuki Unno, Tochigi (JP); Takahiro Matsumoto, Tochigi (JP); Takafumi Miyaharu, Tochigi (JP); Tooru Kawashima, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 770 days.

(21) Appl. No.: 17/577,677

(22) Filed: Jan. 18, 2022

(65) Prior Publication Data

US 2022/0236650 A1 Jul. 28, 2022

(30) Foreign Application Priority Data

Jan. 26, 2021 (JP) .................................. 2021-010627

(51) Int. Cl.
*G03F 9/00* (2006.01)
*G03F 7/00* (2006.01)

(52) U.S. Cl.
CPC .......... *G03F 9/7049* (2013.01); *G03F 7/0002* (2013.01); *G03F 9/7042* (2013.01)

(58) Field of Classification Search
CPC .. G03F 7/0002; G03F 7/70633; G03F 9/7042; G03F 9/7049; G03F 9/7065; G03F 9/7069; G03F 9/7026; G03F 9/7073
See application file for complete search history.

(56) References Cited

U.S. PATENT DOCUMENTS

| 5,347,356 A | 9/1994 | Ota et al. |
| 5,369,486 A | 11/1994 | Matsumoto et al. |
| 10,908,519 B2 | 2/2021 | Mitsugi |
| 2009/0219499 A1 | 9/2009 | Yamaguchi et al. |
| 2014/0268089 A1* | 9/2014 | Shibazaki ............. G03F 9/7003 355/72 |

(Continued)

FOREIGN PATENT DOCUMENTS

| JP | H03272406 A | 12/1991 |
| JP | H0590126 A | 4/1993 |

(Continued)

*Primary Examiner* — Peter B Kim

(74) *Attorney, Agent, or Firm* — ROSSI, KIMMS & McDOWELL LLP

(57) ABSTRACT

A detection apparatus that detects a position deviation between an original and a substrate is provided. The apparatus includes an illumination optical system configured to illuminate a first diffraction grating arranged on the original and a second diffraction grating arranged on the substrate, and a detection optical system configured to detect interference light formed by diffracted light diffracted by the first diffraction grating and diffracted light diffracted by the second diffraction grating. The illumination optical system performs dipole illumination by light including two poles in a pupil plane of the illumination optical system, and polarization directions of light beams emitted from the two poles, respectively, and incident on the substrate are orthogonal to each other.

11 Claims, 9 Drawing Sheets

(56) References Cited

U.S. PATENT DOCUMENTS

| | | |
|---|---|---|
| 2018/0259863 A1 | 9/2018 | Komaki |
| 2019/0371642 A1* | 12/2019 | Iwai .................. H01L 21/681 |
| 2020/0409277 A1 | 12/2020 | Komaki et al. |
| 2022/0357674 A1* | 11/2022 | Hill ..................... G01B 11/26 |

FOREIGN PATENT DOCUMENTS

| | | | |
|---|---|---|---|
| JP | 2009204512 A | | 9/2009 |
| JP | 2011127981 A | * | 6/2011 |
| JP | 2017041608 A | | 2/2017 |
| JP | 2020154063 A | | 9/2020 |
| JP | 2021004940 A | | 1/2021 |
| KR | 1020180041736 A | | 4/2018 |
| KR | 1020190136971 A | | 12/2019 |

\* cited by examiner

F I G. 2
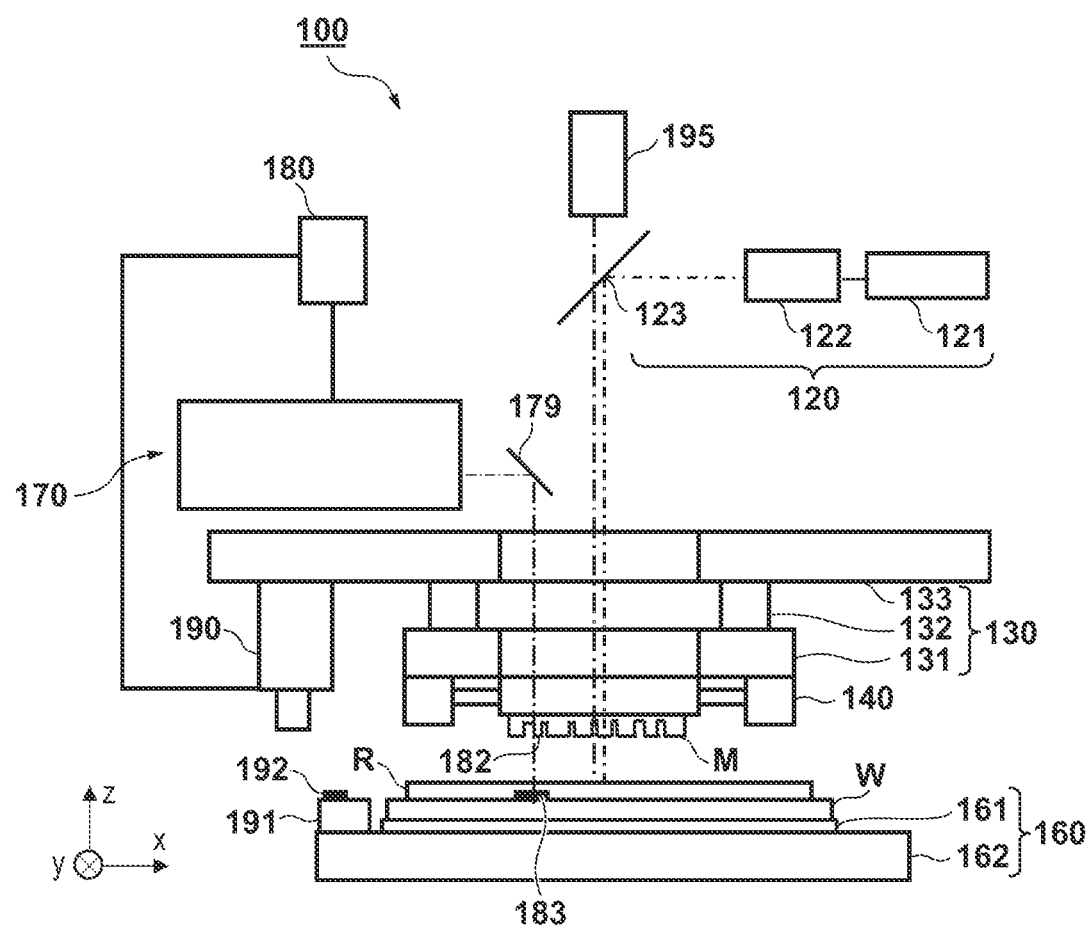

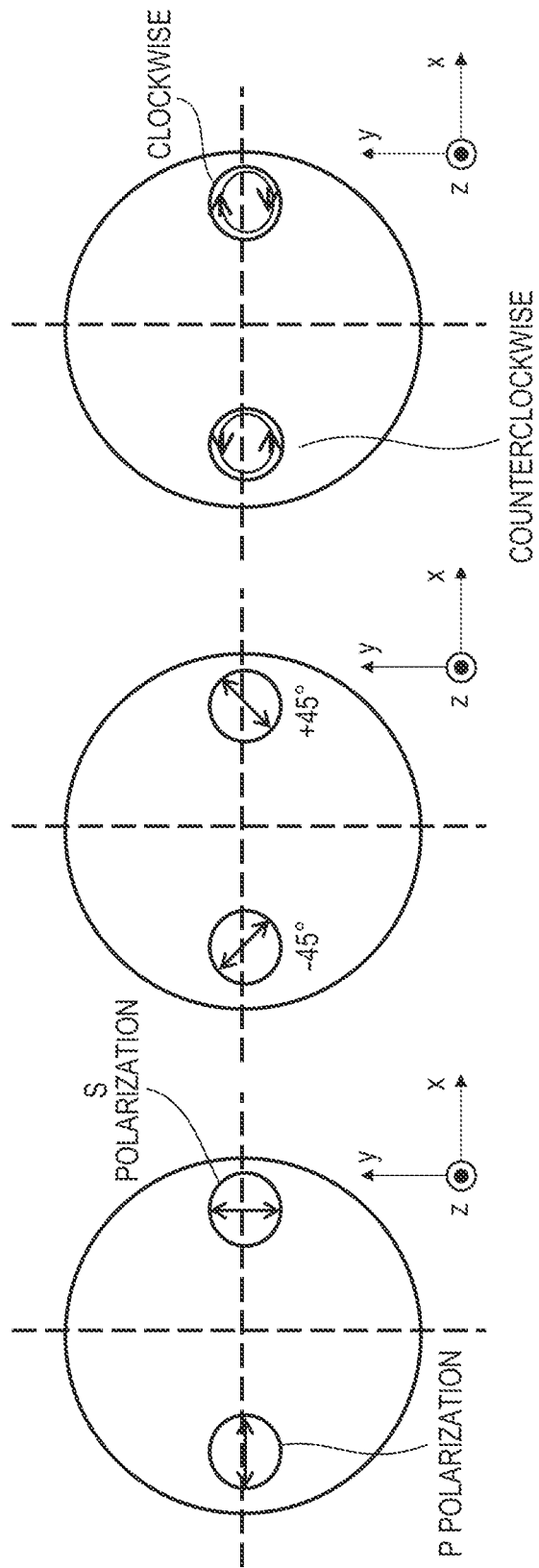

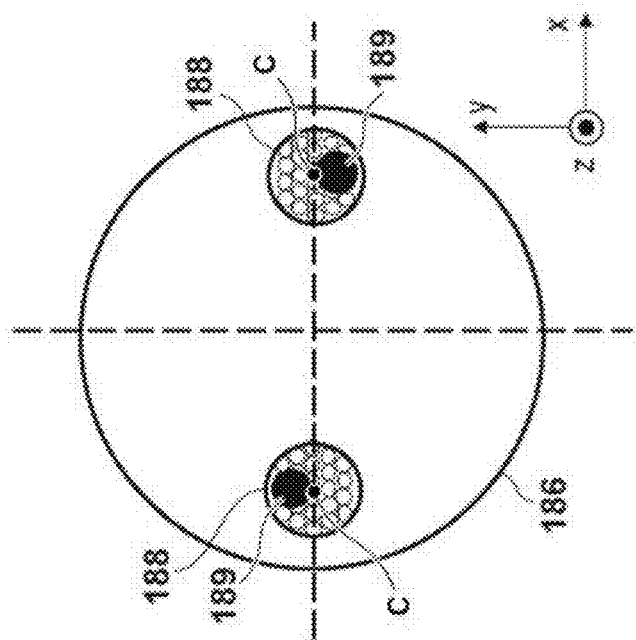
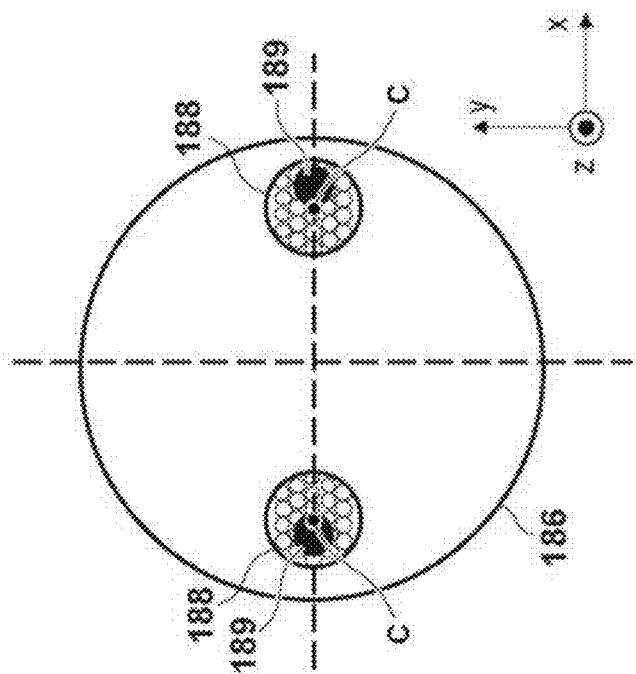

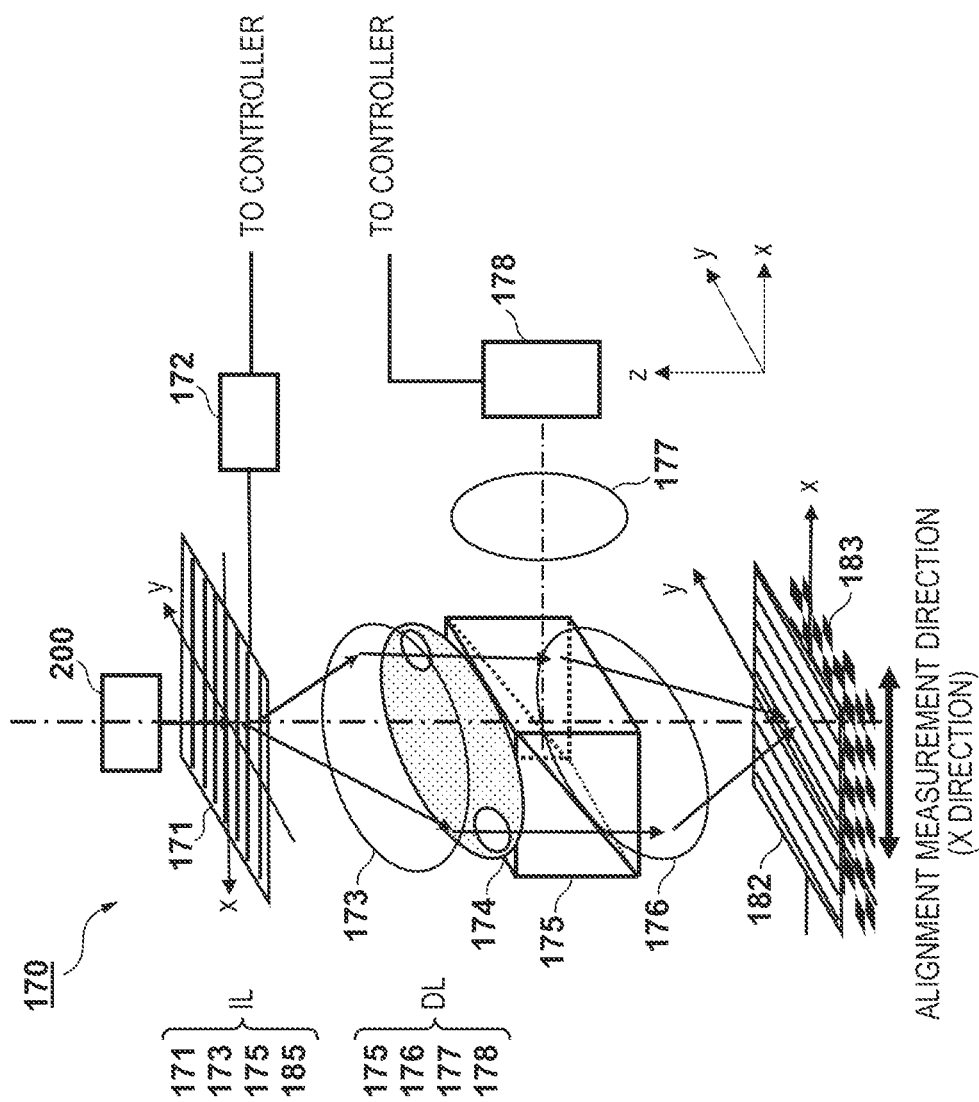
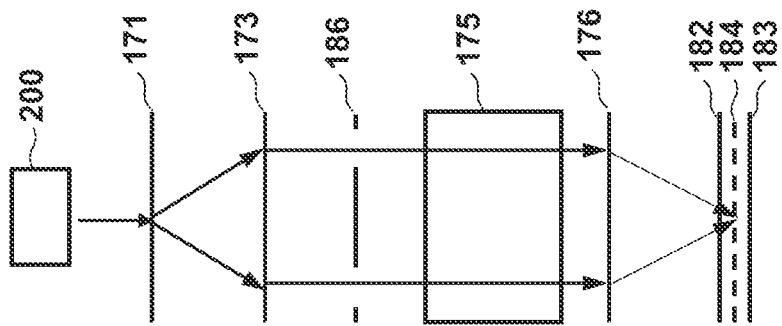
FIG. 7A
FIG. 7B

DETECTION APPARATUS, LITHOGRAPHY APPARATUS, AND ARTICLE MANUFACTURING METHOD This application claims the benefit of Japanese Patent Application No. 2021-010627, filed Jan. 26, 2021, which is hereby incorporated by reference herein in its entirety.

BACKGROUND OF THE INVENTION

Field of the Invention

The present invention relates to a detection apparatus, a lithography apparatus, and an article manufacturing method.

Description of the Related Art

An imprint technique is a technique of forming a pattern on a substrate by molding, using a mold, an imprint material supplied onto the substrate and curing the imprint material. In the imprint technique, one of methods of curing the imprint material is a photo-curing method. In the imprint technique using the photo-curing method, first, a photo-curable imprint material is supplied to a shot region serving as an imprint region on a substrate. Then, a pattern portion of a mold is brought into contact with the imprint material on the shot region, and a concave portion of the pattern portion is filled with the imprint material. In this state, the imprint material is illuminated with light, and this cures the imprint material. Then, by separating the mold from the cured imprint material, a pattern of the imprint material is formed on the substrate.

When forming, on the substrate, a fine pattern such as a circuit pattern using the imprint material, accurate alignment between the substrate and the mold is required. The alignment between the substrate and the mold can be performed using a so-called die-by-die method in which the alignment is performed by detecting a mark formed on the mold and a mark formed for each shot region of the substrate.

Japanese Patent Laid-Open No. 2020-154063 discloses an imprint apparatus including a detector that detects alignment marks formed on a mold and a substrate, respectively, thereby obtaining the X-direction and Y-direction positions on the substrate surface. In Japanese Patent Laid-Open No. 2020-154063, by using a diffraction optical element included in an illumination optical system, illumination light is applied to a template-side mark and a wafer-side mark to generate moire fringes for alignment measurement.

In Japanese Patent Laid-Open No. 2020-154063, illumination (dipole illumination) is used in which the irradiation angle of an object to be detected is limited. A situation occurring on an image plane due to this illumination light will be briefly described. FIG. 1 simply shows the situation of two-beam interference. When light from a light source 001 is branched to two light beams and imaged on an image plane 003 via a lens group 002, two-beam interference generally occurs on the image plane 003. This phenomenon also occurs with the technique described in Japanese Patent Laid-Open No. 2020-154063. More specifically, due to an action of light between poles of the dipole illumination generated by branching light from the single light source to two light beams, two-beam interference occurs on a wafer surface serving as the image plane. Due to the two-beam interference, interference fringes (intensity unevenness) are generated on the wafer surface, and added to the moire fringes to be originally measured. The influence of the interference fringes can degrade the accuracy of alignment measurement.

SUMMARY OF THE INVENTION

The present invention provides, for example, a detection apparatus advantageous in improving the stability of the detection accuracy.

The present invention in its one aspect provides a detection apparatus that detects a position deviation between an original and a substrate, comprising an illumination optical system configured to illuminate a first diffraction grating arranged on the original and a second diffraction grating arranged on the substrate, and a detection optical system configured to detect interference light formed by diffracted light diffracted by the first diffraction grating and diffracted light diffracted by the second diffraction grating, wherein the illumination optical system performs dipole illumination by light including two poles in a pupil plane of the illumination optical system, and polarization directions of light beams emitted from the two poles, respectively, and incident on the substrate are orthogonal to each other.

Further features of the present invention will become apparent from the following description of exemplary embodiments (with reference to the attached drawings).

BRIEF DESCRIPTION OF THE DRAWINGS

FIG. 2 is a view showing the arrangement of an imprint apparatus;

FIGS. 4A to 4C are views each exemplarily showing the polarization directions of dipole illumination;

FIGS. 6A and 6B are views each showing an example of dipole illumination in which the barycenters of poles are shifted from each other;

FIGS. 7A and 7B are views showing the arrangement of a position detection apparatus according to the third embodiment;

DESCRIPTION OF THE EMBODIMENTS

Figure 1:
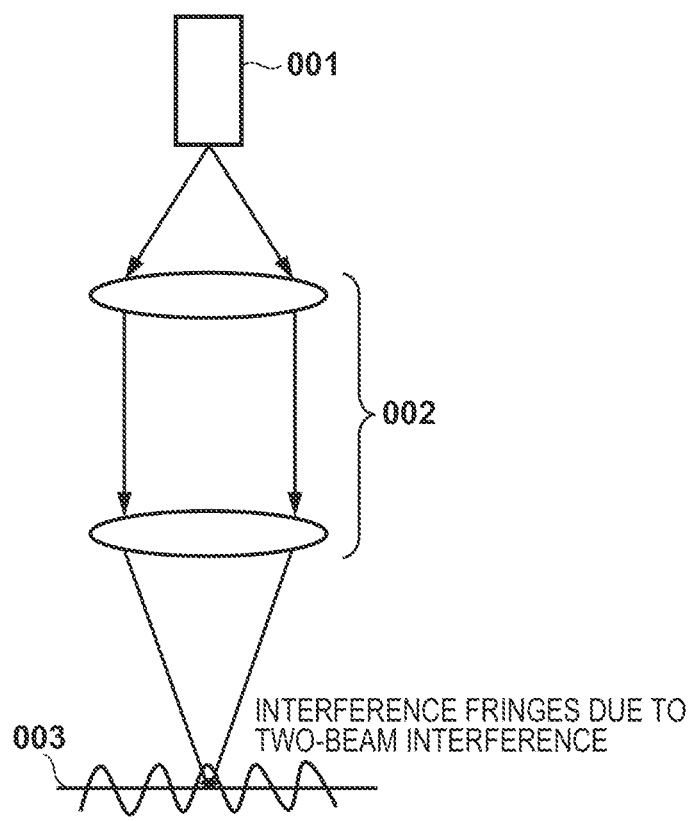
FIG. 1 is a view for explaining two-beam interference.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

One aspect of the present invention relates to a detection apparatus that detects a position deviation between an original and a substrate. The detection apparatus according to the present invention can be applied to alignment between an original and a substrate in a lithography apparatus such as an exposure apparatus or an imprint apparatus, but can also be applied to other apparatuses such as a processing apparatus, an inspection apparatus, and a microscope. An example will be described below in which the detection apparatus according to the present invention is applied to an imprint apparatus which is one of lithography apparatuses.

First, the outline of the imprint apparatus according to an embodiment will be described. The imprint apparatus is an apparatus that brings an imprint material supplied onto a substrate into contact with a mold and applies curing energy to the imprint material, thereby forming a pattern of a cured material to which the concave/convex pattern of the mold has been transferred.

As an imprint material, a curable composition (to be also referred to as a resin in an uncured-state) that is cured by receiving curing energy is used. Examples of the curing energy are an electromagnetic wave, heat, and the like. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged, by an imprint material supply apparatus (a supply unit 190), on the substrate in the form of droplets or in the form of an island or film formed by connecting a plurality of droplets. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

First Embodiment

FIG. 2 is a view showing the schematic arrangement of an imprint apparatus 100 in an embodiment, which includes a position detection apparatus that detects a position deviation between an original and a substrate. In the specification and the drawings, directions will be indicated by an XYZ coordinate system in which the horizontal surface is set as the X-Y plane. In general, a substrate W serving as a substrate to be exposed is placed on a substrate stage 162 such that the surface of the substrate W is parallel to the horizontal surface (X-Y plane). Therefore, in the following description, the directions orthogonal to each other in a plane along the surface of the substrate W are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively, and a rotational direction around the X-axis, a rotational direction around the Y-axis, and a rotational direction around the Z-axis are referred to as the θX direction, the θY direction, and the θZ direction, respectively.

In an example, the imprint apparatus 100 is a UV photo-curing imprint apparatus that cures an imprint material by irradiation of UV light (ultraviolet light). However, the imprint apparatus 100 may be an imprint apparatus that cures an imprint material by irradiation of light in another wavelength range, or may be an imprint apparatus that cures an imprint material by another energy (for example, heat).

The imprint apparatus 100 is configured to form a pattern in each of a plurality of shot regions on the substrate W (wafer) by repeating an imprint process. The imprint process here is a process of forming the pattern in one shot region on the substrate W by curing an imprint material R in a state in which the pattern portion of a mold M is in contact with the imprint material R.

The imprint apparatus 100 can include a curing unit 120 (formed by parts 121 to 123), a mold operation mechanism 130 (formed by parts 131 to 133), a mold shape correction mechanism 140, a substrate driver 160 (formed by parts 161 and 162), a position detection apparatus 170 (also including a part 179), a supply unit 190, an observation scope 195, and a controller 180. Although not shown, the imprint apparatus 100 further includes a bridge plate that supports the mold operation mechanism 130, a base plate that supports the substrate driver 160, and the like.

The curing unit 120 irradiates the imprint material R on the substrate W with ultraviolet light via the mold M, thereby curing the imprint material R. The imprint material R can be an UV curing resin. The curing unit 120 can include, for example, the light source unit 121, the optical system 122, and the half mirror 123. The light source unit 121 can include, for example, a light source such as a mercury lamp that emits ultraviolet light (for example, i-line or g-line), and an ellipse mirror that condenses light emitted by the light source. The optical system 122 is formed by a lens, an aperture, and the like that are used to apply the light for curing the imprint material R to the imprint material in a shot region. The light having passed through the optical system is applied to the imprint material R by the half mirror 123. The aperture is used to control the angle of view or control peripheral light shielding. Controlling the angle of view enables illumination of only a target shot region, and controlling peripheral light shielding enables restriction of irradiation of the ultraviolet light beyond the shot region of the substrate. The optical system 122 may include an optical integrator to evenly illuminate the mold M. The light whose range is defined by the aperture is incident on the imprint material R on the substrate via the optical system 122 and the mold M. The mold M is, for example, a mold on which a concave/convex pattern such as the circuit pattern of a device has been three-dimensionally formed. The material of the mold M is quartz or the like that can transmit ultraviolet light.

The mold operation mechanism 130 can include, for example, the mold chuck 131 that holds the mold M, the mold driving mechanism 132 that drives the mold M by driving the mold chuck 131, and the mold base 133 that supports the mold driving mechanism 132. The mold driving mechanism 132 includes a positioning mechanism that controls the position of the mold M with respect to six axes, and a mechanism that brings the mold M into contact with the imprint material R on the substrate W and separates the mold M from the cured imprint material R. Here, the six axes are the X, Y, Z, θX, θY, and θZ directions.

The mold shape correction mechanism 140 can be mounted on the mold chuck 131. The mold shape correction mechanism 140 can correct the shape of the mold M by, for example, applying a pressure to the mold from the outer peripheral direction using a cylinder operated by a fluid such as air or oil. Alternatively, the mold shape correction mechanism 140 includes a temperature controller that controls the temperature of the mold M, and can correct the shape of the mold M by controlling the temperature of the mold M. The substrate W can deform (typically, expand or contract) via a process such as annealing. In accordance with such deformation of the substrate W, the mold shape correction mechanism 140 corrects the shape of the mold M such that the overlay error between the pattern of the mold M and the existing pattern on the substrate W falls within an allowable range.

The substrate driver 160 can include the substrate chuck 161, the substrate stage 162, the reference mark table 191, and a stage driving mechanism (not shown). The substrate chuck 161 chucks and holds the substrate W. The substrate stage 162 supports the substrate chuck 161, and moves the substrate W by driving the substrate chuck 161. A reference mark 192 is arranged on the reference mark table 191. The stage driving mechanism can include a positioning mechanism that controls the position of the substrate W by controlling the position of the substrate stage 162 with respect to the above-described six axes.

The position detection apparatus 170 (detection apparatus) detects a relative position (position deviation) between the mold M and the shot region on the substrate W. This uses a method in which the position detection apparatus 170 illuminates an alignment mark 182 formed on the mold M and an alignment mark 183 formed on the substrate W and detects the image of interference fringes (also referred to as moire fringes) formed by the light beams diffracted by the two marks, respectively. The controller 180 measures the relative position based on the detected image.

The supply unit 190 supplies the imprint material onto the substrate W. The supply unit 190 can include a tank that stores the imprint material, nozzles that discharge, onto the substrate, the imprint material supplied from the tank via a supply path, a valve provided in the supply path, and a supply amount controller.

The observation scope 195 is a scope for observing the shot region, and includes an image capturing element that captures the image of the shot region. The observation scope 195 is used to check the contact state between the mold M and the imprint material R and the progress of filling of the imprint material R into the concave/convex portion of the pattern of the mold M.

The imprint process performed by the imprint apparatus 100 will be described. The controller 180 causes a substrate conveyance apparatus (not shown) to convey the substrate W onto the substrate chuck 161, and fixes the substrate W on the substrate chuck 161. Then, the controller 180 moves the substrate stage 162 to the position where the imprint material is supplied by the supply unit 190. The supply unit 190 supplies the imprint material R to a predetermined shot region (imprint region) of the substrate W (supply step). Next, the controller 180 moves the substrate stage 162 such that the shot region is located immediately below the mold M.

Then, the controller 180 drives the mold driving mechanism 132 to bring the mold M into contact with the imprint material R on the substrate W (contact step). When the mold M contacts the imprint material R, the imprint material R flows (is filled) along the pattern surface of the mold M. Further, in the state in which the mold M and the imprint material R are in contact with each other, the position detection apparatus 170 detects diffracted light from each of the alignment mark 182 arranged on the mold M and the alignment mark 183 arranged on the substrate W. Based on the detection result, the controller 180 performs alignment between the mold M and the substrate W by driving the substrate stage 162, correction of the mold M by the correction mechanism, and the like. Thus, flowing (filling) of the imprint material R to the pattern surface of the mold M, alignment between the mold M and the substrate W, correction of the mold M, and the like are sufficiently performed. Thereafter, the curing unit 120 applies ultraviolet light from the back surface (upper surface) of the mold M, and cures the imprint material R by the ultraviolet light transmitted through the mold M (curing step). Subsequently, the controller 180 drives the mold driving mechanism 132 again to separate the mold M from the cured imprint material (mold separation step). Thus, the concave/convex pattern of the mold M is transferred to the imprint material R on the substrate W.

Figures 3A, 3B:
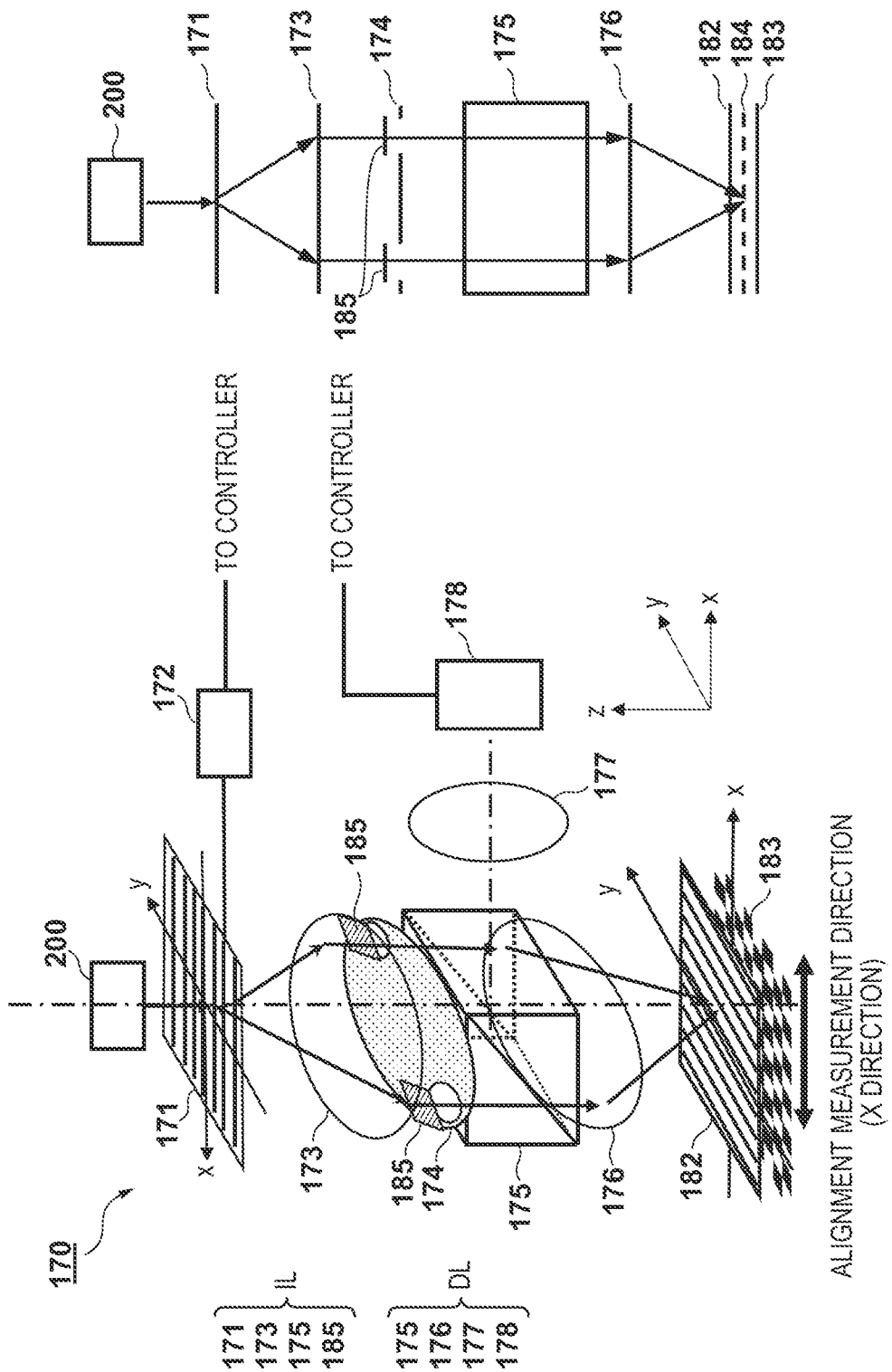
FIGS. 3A and 3B are views showing the arrangement of a position detection apparatus according to the first embodiment.

FIG. 3A is a perspective view of a main part showing the arrangement of the position detection apparatus 170 according to the first embodiment, and FIG. 3B is a Y-Z sectional view of the position detection apparatus 170 shown in FIG. 3A. In order to simplify the description of the optical system, FIG. 3A shows only the optical system that performs measurement in a single direction (for example, X direction). In FIG. 2, the direction of the light emitted from the position detection apparatus 170 is changed by the mirror 179 and the light then illuminates the alignment marks 182 and 183. However, for the sake of illustrative convenience, the mirror 179 is not shown in FIGS. 3A and 3B.

The position detection apparatus 170 includes an illumination optical system IL that illuminates the alignment mark 182 (first mark) arranged on the mold M and the alignment mark 183 (second mark) arranged on the substrate W. The position detection apparatus 170 also includes a detection optical system DL that detects interference light formed by diffracted light beams diffracted by the first mark and the second mark, respectively, illuminated by the illumination optical system IL. The illumination optical system IL is configured so as to perform dipole illumination by light including two poles in the pupil plane of the illumination optical system IL. For example, the illumination optical system IL can include a diffraction optical element 171, a lens 173, a stop 174 for implementing dipole illumination, two polarization elements 185, and a beam splitter 175. The detection optical system DL can include a lens 176, the beam splitter 175, a lens 177, and a photoelectric conversion element 178.

Light from a light source unit 200 illuminates the diffraction optical element 171. The diffracted light generated by the diffraction optical element 171 passes through the lens 173, the stop 174, the two polarization elements 185, the beam splitter 175, and the lens 176, and performs dipole illumination on the alignment mark 182 on the mold M and the alignment mark 183 on the substrate W. The two polarization elements 185 are arranged such that the polarization directions of light beams emitted from the two poles, respectively, and incident on the substrate are orthogonal to each other. The stop 174 is arranged in or near the pupil plane of the illumination optical system IL. The two polarization elements 185 are preferably arranged on the side of the light source with respect to the pupil plane.

The alignment mark 182 (first diffraction grating) and the alignment mark 183 (second diffraction grating) are formed by diffraction gratings that have different pitches in the measurement direction. The alignment mark 183 on the substrate W is formed by a checkerboard grating pattern having a Y-direction grating pitch and an X-direction grating pitch. By the light beams diffracted by the two marks, interference fringes (moire fringes) are generated in the X direction serving as the measurement direction. Here, if the relative position between the mold M and the substrate W changes in the X direction, the phase of the interference fringes changes in accordance with the change of the relative position. The interference fringes are imaged on the light-receiving surface of the photoelectric conversion element 178 by an imaging optical system formed by the lens 176, the beam splitter 175, and the lens 177, and the image information of the interference fringes is transmitted to the controller 180. The controller 180 calculates the relative position (deviation amount) between the mold M and the substrate W based on the image information of the interference fringes, and drives the mold driving mechanism 132 and the substrate stage 162 based on the calculation result, thereby performing alignment adjustment between the mold M and the substrate W.

As has been described above, in this embodiment, the illumination optical system IL in the position detection apparatus 170 is configured to perform dipole illumination by light including two poles in the pupil plane of the illumination optical system, and the polarization directions of the light beams emitted from the two poles, respectively, and incident on the substrate are orthogonal to each other. The two polarization elements 185 make the polarization directions of the two light beams orthogonal to each other on a substrate surface 184, so that the interference fringes generated due to the two-beam interference are reduced. Accordingly, it is possible to improve the stability of the alignment measurement accuracy. In this embodiment, the two polarization elements 185 are arranged on the side of the light source with respect to the pupil plane, but the arrangement positions of the two polarization elements 185 are not limited to this as long as the polarization directions are orthogonal to each other on the substrate surface. For example, the two polarization elements 185 may be arranged on the side of the image plane with respect to the stop 174 used to implement the dipole illumination. Further, in this embodiment, the optical system illuminates the diffraction optical element, but it is not always necessary to use the diffraction optical element as long as two-beam interference occurs in the optical system.

Figure 10:
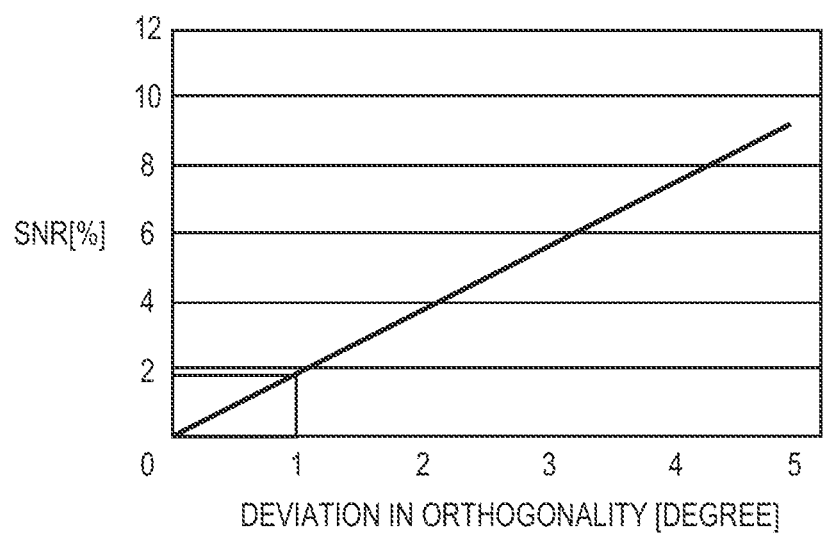
FIG. 10 is a graph showing a characteristic example, which illustrates the sensitivity to performance degradation caused by a deviation in orthogonality between the polarization directions of two poles.

FIG. 10 shows an example of the characteristic, which illustrates the sensitivity to performance degradation caused by a deviation in orthogonality between the polarization directions of the light beams emitted from the two poles and incident on the substrate. In the graph shown in FIG. 10, the abscissa represents the deviation in orthogonality, and the ordinate represents the signal to noise ratio (SNR) serving as the performance index. Within the range of the deviation in orthogonality shown in this characteristic diagram, the deviation in orthogonality and the SNR are almost proportional to each other. According to the characteristic example shown in FIG. 10, it can be seen that in order to reduce the SNR to, for example, 2% or less, it is required to reduce the deviation in orthogonality to about 1° or less. Based on the characteristic as described above, the allowable range of the deviation in orthogonality can be determined in accordance with the desired alignment required accuracy.

Note that if the purpose is simply to reduce the two-beam interference, it is also conceivable to use a method in which not dipole illumination but monopole illumination is used. However, in this case, the defocus state changes due to a change in apparatus environment such as a change in atmospheric pressure. If the defocus state changes, the image may be shifted due to the asymmetric illumination and the performance may be degraded.

EXAMPLE 1

In Example 1, the polarization directions of the light beams emitted from the two poles and incident on the substrate by the dipole illumination can form a combination of P polarization and S polarization. For example, one of the two polarization elements 185 can be a linearly-polarizing polarization plate arranged so as to cause P polarization, and the other can be a linearly-polarizing polarization plate arranged so as to cause S polarization. An example of the polarization directions when viewing, in the Z direction, the dipole illumination in this case is shown in FIG. 4A. As shown in FIG. 4A, the polarization directions of the P polarization and S polarization are preferably matched with the X direction and the Y direction, respectively, which are the arrangement directions of the gratings forming the alignment marks.

EXAMPLE 2

In Example 2, the polarization directions of the light beams emitted from the two poles and incident on the substrate by the dipole illumination can form a combination of +45° polarization and −45° polarization. For example, one of the two polarization elements 185 can be a linearly-polarizing polarization plate arranged so as to cause +45° polarization, and the other can be a linearly-polarizing polarization plate arranged so as to cause −45° polarization. An example of the polarization directions when viewing, in the Z direction, the dipole illumination in this case is shown in FIG. 4B.

EXAMPLE 3

In Example 3, the polarization directions of the light beams emitted from the two poles and incident on the substrate by the dipole illumination can form a combination of counterclockwise circular polarization and clockwise circular polarization. For example, one of the two polarization elements 185 can be a circularly-polarizing polarization element arranged so as to cause counterclockwise circular polarization, and the other can be a circularly-polarizing polarization element arranged as to cause clockwise circular polarization. In one example, the two polarization elements 185 can form a combination of a polarization plate and a λ/4 wavelength plate. An example of the polarization directions when viewing, in the Z direction, the dipole illumination in this case is shown in FIG. 4C.

Second Embodiment

Figures 5A, 5B:
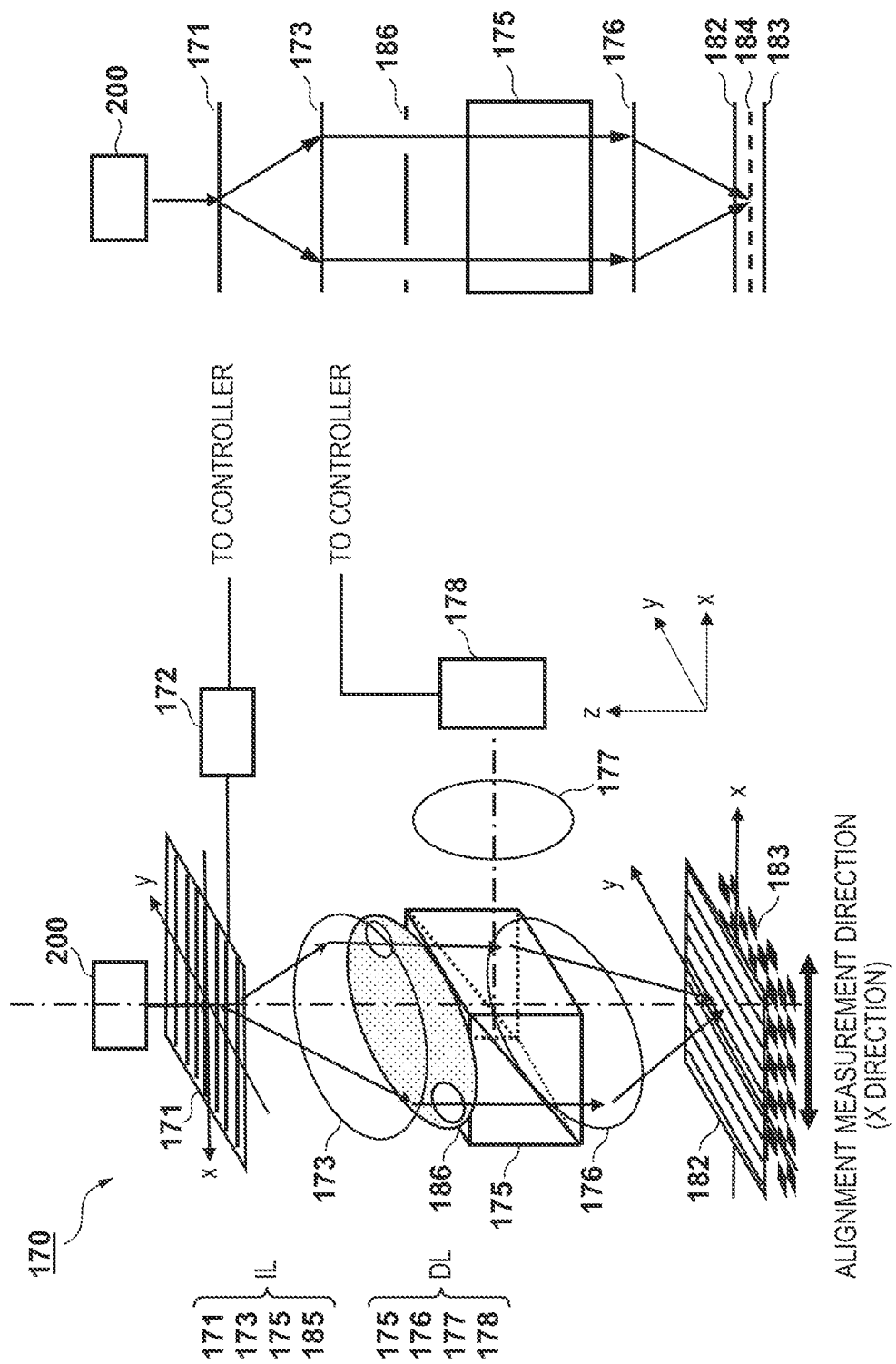
FIGS. 5A and 5B are views showing the arrangement of a position detection apparatus according to the second embodiment.

FIG. 5A is a perspective view of a main part showing the arrangement of a position detection apparatus 170 according to the second embodiment, and FIG. 5B is a Y-Z sectional view of the position detection apparatus 170 shown in FIG. 5A. In order to simplify the description of the optical system, FIG. 5A shows only the optical system that performs measurement in a single direction (for example, X direction). In FIG. 2, the direction of the light emitted from the position detection apparatus 170 is changed by a mirror 179 and the light then illuminates alignment marks 182 and 183. However, for the sake of illustrative convenience, the mirror 179 is not shown in FIGS. 5A and 5B.

The position detection apparatus 170 shown in FIGS. 5A and 5B is different from that shown in FIGS. 3A and 3B according to the first embodiment in that it does not include the two polarization elements 185 and it includes a stop 186 in place of the stop 174. The stop 186 is a stop for changing an illumination shape, and arranged in or near the pupil plane of an illumination optical system IL. With the arrangement shown in FIGS. 5A and 5B, the illumination optical system IL performs dipole illumination by light including two poles in its pupil plane.

Figure 9:
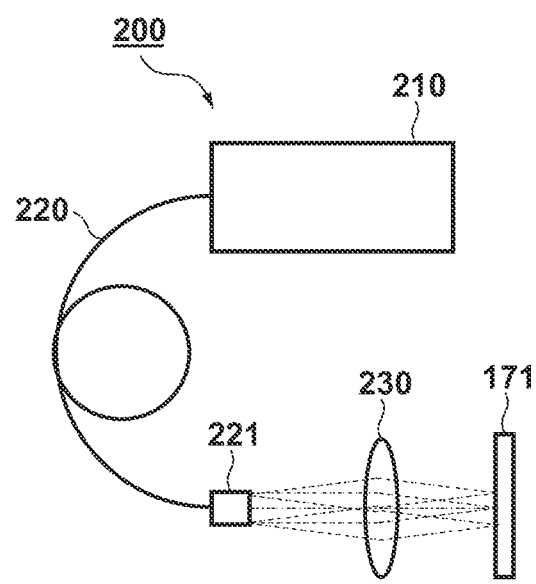
FIG. 9 is a view showing an arrangement example of a light source unit.

FIG. 9 shows an arrangement example of a light source unit 200. In FIG. 9, light from a laser light source 210 is guided by a fiber 220. The light emitted from an exit end 221 of the fiber 220 illuminates a diffraction optical element 171 via a lens 230.

FIG. 6A shows an example of two poles when viewing, in the Z direction, the dipole illumination in this embodiment. In FIG. 6A, the stop 186 located in the pupil plane includes two light transmissive portions 189 represented by black circles. FIG. 6A also shows that the exit end 221 of the fiber 220 is Koehler-illuminated and images 188 of the exit end 221 are formed in the pupil plane. The fiber 220 is formed as a bundle of a plurality of fiber element wires, and each white circle represents the image of the fiber element wire of the fiber 220. Here, the barycenters C of two poles forming the dipole illumination are shifted from each other. Further, the light beams passing through the poles, respectively, have not passed through the same fiber element wire among the plurality of fiber element wires forming the fiber 220. With this arrangement, the interference fringes generated due to the two-beam interference can be reduced. Accordingly, it is possible to improve the stability of the alignment measurement accuracy. Note that in FIG. 6A, the transmissive portions 189 of the two poles are shifted from each other on the X-axis, but as shown in FIG. 6B, the transmissive portions 189 of the two poles are not necessarily shifted from each other on the X-axis.

Third Embodiment

FIG. 7A is a perspective view of a main part showing the arrangement of a position detection apparatus 170 according to the third embodiment, and FIG. 7B is a Y-Z sectional view of the position detection apparatus 170 shown in FIG. 7A. In order to simplify the description of the optical system, FIG. 7A shows only the optical system that performs measurement in a single direction (for example, X direction). In FIG. 2, the direction of the light emitted from the position detection apparatus 170 is changed by a mirror 179 and the light then illuminates alignment marks 182 and 183. However, for the sake of illustrative convenience, the mirror 179 is not shown in FIGS. 7A and 7B.

The position detection apparatus 170 shown in FIGS. 7A and 7B is different from that shown in FIGS. 3A and 3B according to the first embodiment in that it does not include the two polarization elements 185.

In this embodiment, the position of a substrate surface 184 serving as the image plane is intentionally defocused in the Z direction with respect to the best focus position which is a design value. The position detection apparatus 170 performs illumination by an illumination optical system IL and detection by a detection optical system DL in a state in which the surface position of the substrate is defocused. With this, interference fringes generated due to the two-beam interference are reduced more than at the best focus. Accordingly, it is possible to improve the stability of the alignment measurement accuracy.

Fourth Embodiment

It is also possible to use an arrangement obtained by appropriately combining the arrangements according to the first embodiment, the second embodiment, and the third embodiment described above. With this, it is possible to suppress a degradation in accuracy of the alignment measurement.

Fifth Embodiment

In each of the first embodiment to the fourth embodiment described above, for the sake of descriptive convenience, only the optical system that performs measurement in a single direction has been shown. However, the position detection apparatus can have an arrangement in which measurement of a position in the X direction and measurement of a position in the Y direction are simultaneously performed.

Figure 8:
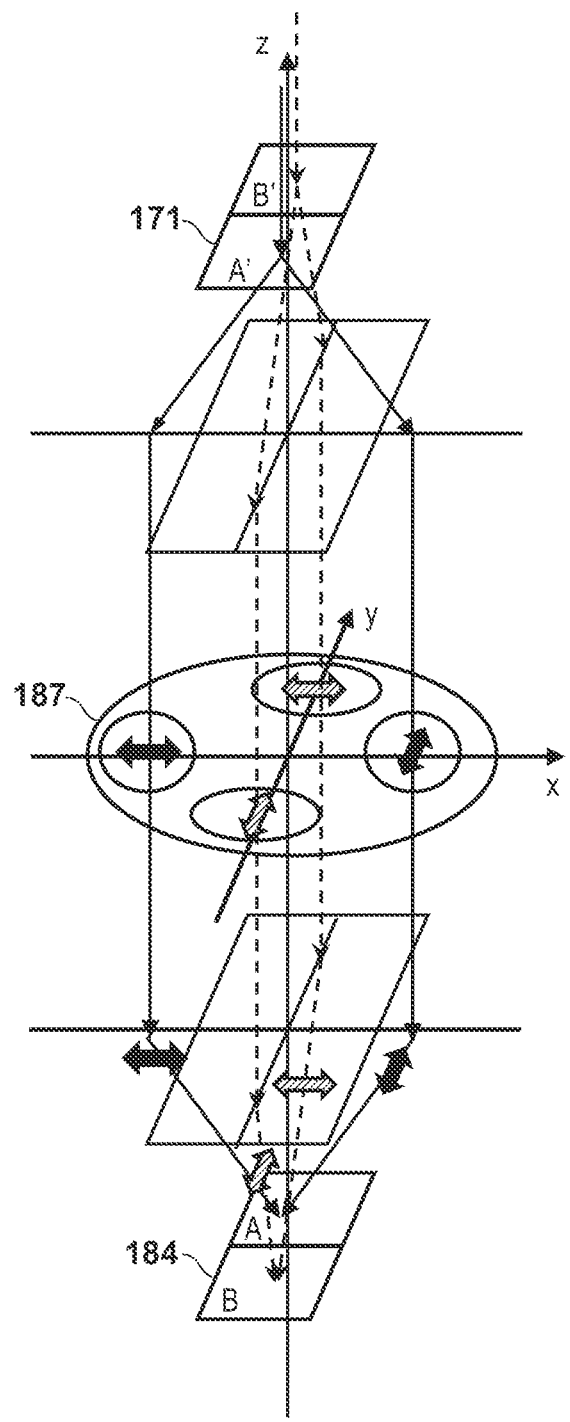
FIG. 8 is a view showing the arrangement of a position detection apparatus according to the fifth embodiment.

FIG. 8 shows an arrangement example in a case in which the polarization element according to Example 1 in the first embodiment is applied to simultaneous measurement in the X direction and the Y direction. A pupil plane 187 shown in FIG. 8 is a simplified representation of the lens 173, the stop 174, the lens 176, and the polarization elements 185 shown in FIG. 3A.

A diffraction optical element 171 includes a first region A' that forms illumination light for illuminating a first portion A of a substrate surface 184, and a second region B' that forms illumination light for illuminating a second portion B different from the first portion A of the substrate surface 184. The first region A' of the diffraction optical element 171 diffracts light in the X direction in the surface of the diffraction optical element 171. The light diffracted in the X direction passes through the polarization elements 185 located in the pupil plane 187. The light of the polarization direction in the X direction passes through two poles arranged in the X direction, and illuminates the first portion A of the substrate surface 184. By evaluating the interference fringes in the first portion A of the substrate surface 184, it is possible to calculate the deviation amount of the relative position between a mold M and a substrate W in the Y direction.

Similarly, the second region B' of the diffraction optical element 171 diffracts light in the Y direction in the surface of the diffraction optical element 171. The light diffracted in the Y direction passes through the polarization elements 185 located in the pupil plane 187. The light of the polarization direction in the Y direction passes through two poles arranged in the Y direction, and illuminates the second portion B of the substrate surface 184. By evaluating the interference fringes in the second portion B of the substrate surface 184, it is possible to calculate the deviation amount of the relative position between the mold M and the substrate W in the X direction.

As has been described above, it is possible to simultaneously perform measurement of the position deviation in the X direction (first direction) and measurement of the position deviation in the Y direction (the second direction intersecting the first direction). Also in each of the other embodiments, it is similarly possible to simultaneously perform measurement of the position deviation in the X direction and measurement of the position deviation in the Y direction.

<Embodiment of Article Manufacturing Method>

An article manufacturing method according to an embodiment of the present invention is suitable for manufacturing an article such as a microdevice, for example a semiconductor device, or an element having a microstructure. This article manufacturing method according to this embodiment includes a step of transferring the pattern of an original on a substrate by using a lithography apparatus (an exposure apparatus, imprinting apparatus, drawing apparatus, or the like), and a step of processing the substrate on which the pattern has been transferred in the preceding step. The manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-010627, filed Jan. 26, 2021, which is hereby incorporated by reference herein in its entirety.

What is claimed is:

1. A detection apparatus that detects a position deviation between an original and a substrate, comprising:
   an illumination optical system configured to illuminate a first diffraction grating arranged on the original and a second diffraction grating arranged on the substrate; and
   a detection optical system configured to detect interference light formed by diffracted light diffracted by the first diffraction grating and diffracted light diffracted by the second diffraction grating,
   wherein the illumination optical system performs dipole illumination by light including two poles in a pupil plane of the illumination optical system, and polarization directions of light beams emitted from the two poles, respectively, and incident on the substrate are orthogonal to each other, and
   illumination by the illumination optical system and detection by the detection optical system are performed in a state in which a surface position of the substrate is defocused.

2. The apparatus according to claim 1, wherein the polarization directions of the light beams emitted from the two poles, respectively, form a combination of P polarization and S polarization.

3. The apparatus according to claim 1, wherein the polarization directions of the light beams emitted from the two poles, respectively, form a combination of +45° polarization and −45° polarization.

4. The apparatus according to claim 1, wherein the polarization directions of the light beams emitted from the two poles, respectively, form a combination of counterclockwise circular polarization and clockwise circular polarization.

5. The apparatus according to claim 1, wherein measurement of a position deviation in a first direction and measurement of a position deviation in a second direction intersecting the first direction are simultaneously performed.

6. The apparatus according to claim 5, wherein the illumination optical system comprises an optical element including a first region which forms illumination light for illuminating a first portion of the substrate, and a second region which forms illumination light for illuminating a second portion different from the first portion of the substrate.

7. The apparatus according to claim 6, wherein the optical element is a diffraction optical element.

8. A lithography apparatus that forms a pattern on a substrate using an original, comprising:
   a detection apparatus defined in claim 1, configured to detect a position deviation between the original and the substrate; and
   a controller configured to control a position of the substrate based on a detection result obtained by the detection apparatus.

9. An article manufacturing method comprising:
   forming a pattern on a substrate using a lithography apparatus defined in claim 8; and
   processing the substrate on which the pattern has been formed in the forming,
   wherein an article is manufactured from the substrate processed in the processing.

10. A detection apparatus that detects a position deviation between an original and a substrate, comprising:
    an illumination optical system configured to illuminate a first diffraction grating arranged on the original and a second diffraction grating arranged on the substrate; and
    a detection optical system configured to detect interference light formed by diffracted light diffracted by the first diffraction grating and diffracted light diffracted by the second diffraction grating,
    wherein the illumination optical system comprises a fiber including a plurality of fiber element wires each of which guides light from a light source, and is configured such that an image of an exit end of the fiber is formed in a pupil plane of the illumination optical system, and
    the illumination optical system performs dipole illumination by light including two poles in the pupil plane, barycenters of the two poles being shifted from each other, and light beams passing through the two poles, respectively, have not passed through the same fiber element wire among the plurality of fiber element wires, and
    illumination by the illumination optical system and detection by the detection optical system are performed in a state in which a surface position of the substrate is defocused.

11. A detection apparatus that detects a position deviation between an original and a substrate, comprising:
    an illumination optical system configured to illuminate a first diffraction grating arranged on the original and a second diffraction grating arranged on the substrate; and
    a detection optical system configured to detect interference light formed by diffracted light diffracted by the first diffraction grating and diffracted light diffracted by the second diffraction grating,
    wherein the illumination optical system performs dipole illumination by light including two poles in a pupil plane of the illumination optical system, and
    illumination by the illumination optical system and detection by the detection optical system are performed in a state in which a surface position of the substrate is defocused.

* * * * *